United States Patent [19]

Tsuboi et al.

[11] Patent Number: 5,086,413
[45] Date of Patent: Feb. 4, 1992

[54] NON-VOLATILE SEMICONDUCTOR MEMORY DEVICE HAVING AN IMPROVED TESTING MODE OF OPERATION AND METHOD OF FORMING CHECKERWISE TEST PATTERN IN MEMORY CELL ARRAY

[75] Inventors: Toshihide Tsuboi; Norio Funahashi, both of Tokyo, Japan

[73] Assignee: Nec Corporation, Tokyo, Japan

[21] Appl. No.: 558,358

[22] Filed: Jul. 27, 1990

[30] Foreign Application Priority Data

Jul. 27, 1989 [JP] Japan .................................. 1-194792

[51] Int. Cl.$^5$ ............................................. G11C 13/00
[52] U.S. Cl. ........................... 365/230.01; 365/230.08; 365/201
[58] Field of Search ....................... 365/189.01, 189.04, 365/230.01, 230.05, 230.06, 230.08 X, 190, 210 X

[56] References Cited

U.S. PATENT DOCUMENTS 5,036,491 7/1991 Yamaguchi ..................... 365/189.04

Primary Examiner—Terrell W. Fears
Attorney, Agent, or Firm—Sughrue, Mion, Zinn, Macpeak & Seas

[57] ABSTRACT

An EEPROM device comprises a memory cell array having a plurality of non-volatile memory cells respectively disposed at locations defined by word lines and bit lines and memorizing pieces of data information in a rewriteable manner, respectively, a row address decoder circuit responsive to an address signal indicative of a row address for selectively activating one of the word lines, a column address decoder circuit responsive to an address signal indicative of a column address for selecting one of the bit lines, and a data control unit selectively carrying out erasing, write-in and read-out operations on one of the non-volatile memory cells, in which the row address decoder circuit is further operative to concurrently activate every second word line in the presence of the row address signal indicative of a first state and to concurrently activate the other word lines in the presence of the row address signal indicative of a second state in a testing mode of operation, and in which the data control unit carries out the erase and write-in operations on a plurality of the non-volatile memory cells coupled to the word lines to be activated in the testing mode of operation.

19 Claims, 5 Drawing Sheets

NON-VOLATILE SEMICONDUCTOR MEMORY DEVICE HAVING AN IMPROVED TESTING MODE OF OPERATION AND METHOD OF FORMING CHECKERWISE TEST PATTERN IN MEMORY CELL ARRAY

FIELD OF THE INVENTION

This invention relates to a non-volatile semiconductor memory device and, more particularly, to an electrically erasable and programmable read only memory device (which is hereinbelow abbreviated as "EEPROM device").

DESCRIPTION OF THE RELATED ART

The EEPROM device is responsive to not only an electrically data reading-out request but also an electrically data write-in request and maintains data bits written thereinto after cutting the power supply off. These features are attractive to electronic systems, and the EEPROM provides a data storage and/or a program storage in a microcomputer system by way of example.

When a data bit is requested to be replaced with a new data bit, the data bit already written into the EEPROM is firstly erased, and the new data bit is, then, written into the memory cell. The replacement of data bit consumes an extremely long time period in comparison with a data read-out operation. In fact, each of the data erasing and data write-in operations consumes about 5 millisecond, and, therefore, about 10 millisecond is necessary for each data replacement.

Prior to delivery at the manufacturing facility, the EEPROM is usually checked to see whether or not any defect is contained therein, and one of the check points is an interference between data bits memorized in adjacent memory cells. In this diagnosis, test data bits opposite in logic level are firstly written into every two adjacent memory cells, and a bit pattern for the diagnosis is something like checkers. The test data bits are, then, read out from the memory cells and are examined to see if any invention in logic level takes place in the checkerwise bit pattern.

However, since every data write-in operation consumes 10 millisecond, the diagnosis consumes an extremely large amount of time period in the interference. For example, if the EEPROM device is of the 256 word memory, the checkerwise bit pattern needs about 2.56 seconds.

SUMMARY OF THE INVENTION

It is therefore an important object of the present invention to provide a non-volatile semiconductor memory device which quickly forms a checkerwise bit pattern in the memory cell array thereof so that the diagnosis merely consumes a relatively short time period.

It is also an important object of the present invention to provide a method of forming a checkerwise test pattern which consumes an extremely short time period.

To accomplish these objects, the present invention proposes to activate every second word line so as to concurrently write data bits of a predetermined logic level thereinto.

In accordance with one aspect of the present invention, there is provided a non-volatile semiconductor memory device comprising a) a plurality of word lines, b) a plurality of bit lines defining a plurality of locations in combination with the word lines, c) a memory cell array having a plurality of non-volatile memory cells respectively disposed at the locations and memorizing pieces of data information in a rewriteable manner, respectively, d) a row address decoder circuit responsive to an address signal indicative of a row address for selectively activating at least one of the word lines, e) a column address decoder circuit responsive to an address signal indicative of a column address for selecting at least one of the bit lines, and f) data means for selectively carrying out erasing, write-in and read-out operations on at least one of the non-volatile memory cells located at the location defined by aforesaid one of the word lines in combination with aforesaid one of the bit lines, in which the row address decoder circuit has means for concurrently activating at least every second word line in the presence of a test signal if the row address signal is indicative of a first state, and in which the means of the row address decoder circuit concurrently activate the other word lines in the presence of the test signal when the row address signal is indicative of a second state, wherein the data means carry out at least the erasing and write-in operations on a plurality of the non-volatile memory cells coupled to the word lines to be activated in the presence of the test signal.

In accordance with another aspect of the present invention, there is provided a method of forming a checkerwise test pattern in a plurality of non-volatile memory cells arranged in rows and columns incorporated in a non-volatile semiconductor memory device, the non-volatile memory device further comprising a plurality of word lines for concurrently activating the rows of the non-volatile memory cells, respectively, and data means for erasing and writing pieces of data information from and into the plurality of non-volatile memory cells, comprising the steps of: a) driving all of the word lines for activating all of the non-volatile memory cells; b) concurrently erasing pieces of data information previously memorized in the non-volatile memory cells; c) concurrently writing first pieces of data information into all of the non-volatile memory cells; d) driving every second word lines for activating the non-volatile memory cells coupled to every second word line; e) concurrently erasing the first pieces of data information from the non-volatile memory cells coupled to every second word line; and f) concurrently writing second pieces of data information into the non-volatile memory cells coupled to every second word line, in which each of the first pieces of data information is indicated by a first bit string different from a second bit string indicative of each of the second pieces of data information.

In accordance with still another aspect of the present invention, there is provided a method of forming a checkerwise test pattern in a plurality of non-volatile memory cells arranged in rows and columns incorporated in a non-volatile semiconductor memory device, the non-volatile memory device further comprising a plurality of word lines for concurrently activating the rows of the non-volatile memory cells, respectively, and data means for erasing and writing pieces of data information from and into the plurality of non-volatile memory cells, comprising the steps of: a) driving the odd word lines of the plurality of word lines for activating the non-volatile memory cells coupled thereto; b) concurrently erasing pieces of data information previously memorized in the non-volatile memory cells coupled to the odd word lines; c) concurrently writing first pieces of data information into the non-volatile memory cells coupled to the odd word lines d) driving the even word lines of the plurality of word lines for activating the non-volatile memory cells coupled thereto; e) concurrently erasing pieces of data information previously memorized in the non-volatile memory cells coupled to the even word lines; and f) concurrently writing second pieces of data information into the non-volatile memory cells coupled to the even word lines, in which each of the first pieces of data information is indicated by a first bit string different from a second bit string indicative of each of the second pieces of data information.

BRIEF DESCRIPTION OF THE DRAWINGS

The features and advantages of a non-volatile memory device according to the present invention will be more clearly understood from the following description taken in conjunction with the accompanying drawings in which.

DESCRIPTION OF THE PREFERRED EMBODIMENTS

First Embodiment

Figure 1:
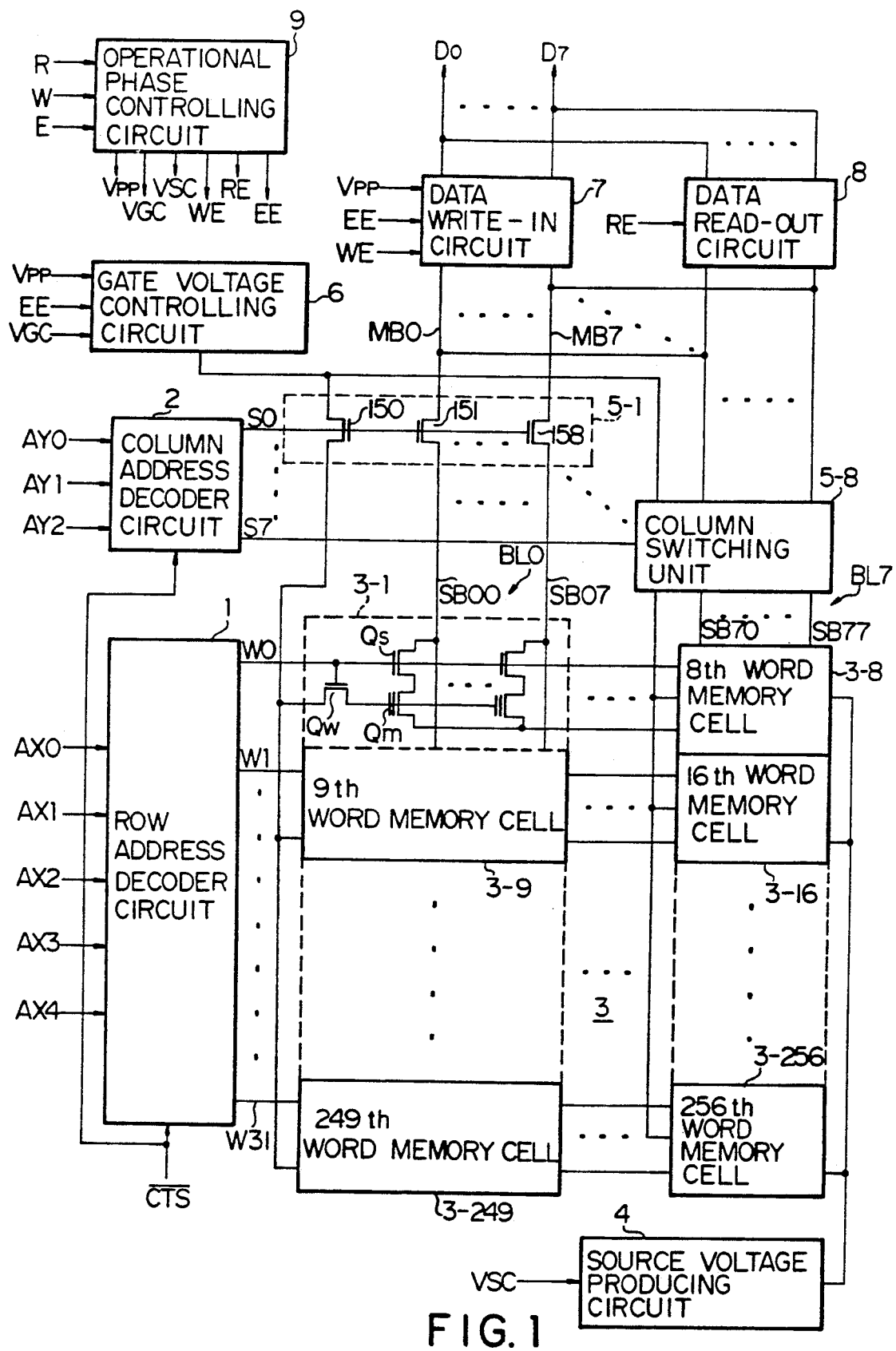
FIG. 1 is a block diagram showing the circuit arrangement of an EEPROM device according to the present invention.

FIG. 1 shows the circuit arrangement of an EEPROM device embodying the present invention. In this instance, every eight data bits constitute a data word and a data word or the eight data bits are concurrently read out from and rewritten into the EEPROM in a single data read-out operation and a single data rewriting operation. An eight-bit address signal is fed to the EEPROM device, and, therefore, the EEPROM device is as large in memory capacity as 256 words by 8 bits, i.e. 2048 bits. The high order five bits Ax0, Ax1, Ax2, Ax3 and Ax4 of the address signal are supplied to a row address decoder circuit 1 and are indicative of a row address. The low order three bits Ay0, Ay1 and Ay2 are directed to a column address decoder circuit 2 and are indicative of a column address. Since every data word is assigned to eight non-volatile memory cell elements (which are hereinbelow referred to as "a word memory cell"), a memory cell array 3 contains 256 word memory cells 3-1 to 3-256 arranged in 32 rows and 8 columns. Word lines W0 to W31 are respectively coupled to the 32 rows of the word memory cells 3-1 to 3-256, and eight bit lines BL0 to BL7 are associated with the 8 columns of the word memory cells 3-1 to 3-256. Each of the bit lines BL0 to BL7 consists of eight sub-bit lines, and the sub-bit lines are labeled as SB00 to SB07, . . . and SB70 to SB77. Since all of the word memory cells are similar in arrangement to one another, description is focused upon the word memory cell 3-1 for the sake of simplicity.

The word memory cell 3-1 has a word selecting transistor Qw and eight memory cell elements respectively coupled to the sub-bit lines SB00 to SB07 of the associated bit line BL0, and each memory cell element is formed by a series combination of a switching transistor Qs and a memory transistor Qm of a floating gate type. Each of the memory cell elements memorizes a data bit forming a part of a data word. The series combination of the switching transistor Qs and the memory transistor Qm provides and blocks a current path between the associated sub-bit line SB00 and a source voltage producing circuit 4 depending upon a data bit memorized therein. The switching transistor Qs is coupled at the gate electrode thereof to the associated word line W0, and the word line W0 is further coupled to the corresponding switching transistors incorporated in the second to eighth word memory cells. The control gate electrode of the memory transistor Qm is coupled to the source node of the word selecting transistor Qw. The row address decoder circuit 1 selectively activates one of the word lines W0 to W31 depending upon the row address indicated by the high order bits Ax0 to Ax4, and the eight word memory cells incorporated in one of the 32 rows are concurrently designated with the activated word line. All of the component transistors are of the n-channel type.

Eight column switching units 5-1 to 5-8 are respectively provided in association with the eight bit lines B10 to BL7, and eight main bit lines MB0 to MB7 are shared between the eight bit lines BL0 to BL7. In other words, the eight main bit lines MB0 to MB7 ar coupled to the eight sub-bit lines of one of the eight bit lines BL0 to BL7. Description is made on the column switching unit 5-1 only because all of the column switching units 5-1 to 5-8 are similar in arrangement. The column switching units 5-1 has eight switching transistors 151, . . . and 158, and eight sub-bit lines SB00 to SB70 are respectively coupled to the switching transistors 151 to 158. The column switching units 5-1 further has a gate transistor 150 which can provide a current path between a gate voltage controlling circuit 6 and the source node of the word selecting transistor Qw as well as the source nodes of the corresponding word selecting transistors incorporated in the leftmost column of the word memory cells 3-1 to 3-256. A column selecting line S0 is coupled to the gate electrodes of the switching transistors 151 to 158 and the gate transistor 150, and eight column selecting lines S0 to S7 are provided for the eight column switching units 5-1 to 5-8, respectively. All of the component transistors are of the n-channel type.

The column address decoder circuit 2 selects one of the column selecting lines S0 to S7 depending upon the column address designated by the low order three bits Ay0 to Ay2, and all of the gate transistor 150 and the switching transistors 151 to 158 incorporated in one of the column switching units turn on so that signal paths are established between one of the bit lines BL0 to BL7 and one of the main bit lines MB0 to MB7. The eight main bit lines MB0 to MB7 are coupled in parallel to a data write-in circuit 7 and a data read-out circuit 8, and eight data input-and-output lines D0 to D7 are further coupled in parallel to the data write-in circuit 7 and the data read-out circuit 8. Thus, the data write-in circuit 7 or the data read-out circuit 8 is coupled through one of the column switching units 5-1 to 5-8 and one of the bit lines BL0 to BL7 to one of the word memory cell designated by the activated one of the word lines W0 to W31.

An operational phase controlling circuit 9 is responsive to an erasing signal E, a write-in signal W and a read-out signal R (which are hereinbelow referred to as "external control signals") and produces various internally controlling signals EE, RE, WE, VSC and VGC and a high-voltage signal Vpp. The EEPROM device shown in FIG. 1 has a usual mode of operation and a testing mode of operation, and the usual mode of operation has a read-out sub-mode and a rewrite sub-mode. The rewrite sub-mode consists of an erasing phase of operation followed by a data write-in phase of operation, and the testing mode of operation is constituted by the erasing phase of operation, the data write-in phase of operation and a data read-out phase of operation. In other words, the testing mode of operation has the rewrite sub-mode operation and the read-out phase of operation.

Assuming now that the address signal Ax0 to Ax4 and Ay0 to Ay2 designates the first word memory cell 3-1, the rewrite sub-mode firstly starts in the presence of the erasing signal E. With the erasing signal E, the operational phase controlling circuit 9 shifts the erase enable signal EE to an active level and allows the source controlling signal VSC and the gate controlling signal VGC to go up to a high voltage level. The operational phase controlling circuit 9 further produces the high voltage signal Vpp, but the read enable signal RE and the write enable signal WE remain inactive. The data read-out circuit 8 enters the high-impedance state because of the read enable signal RE of the inactive level, and the data write-in circuit 7 causes the main bit lines MB0 to MB7 to be grounded. However, the main bit lines MB0 to MB7 may enter a floating state in another EEPROM device according to the present invention. The gate voltage controlling circuit 6 supplies the high voltage signal Vpp to the control gates of the memory transistors Qm of the first word memory cell 3-1 through the transistors 150 and Qw which respectively turn on with the column selecting signal S0 and the word line W0. Since the source controlling signal VSC causes the source voltage producing circuit 4 to supply a ground voltage level to the source nodes of the memory transistors Qm of the fist word memory cell 3-1. In this situation, electrons are injected into the floating gates of the memory transistors Qm of the first word memory cell 3-1, and all of the memory transistors Qm are changed to enhancement mode field effect transistors, respectively, thereby entering an erasing state. The threshold level in the erasing state is hereinbelow referred to as "first threshold level".

When the erasing phase of operation is completed, the erasing signal E is removed, and the write-in signal WE is supplied to the operational phase controlling circuit 9. The operational phase controlling circuit 9 inactivates the erase enable signal EE but activates the write enable signal WE. The source controlling signal VSC is shifted from the high level to a low level, however, other internal controlling signals are unchanged. With the write enable signal WE the data write-in circuit 7 supplies the high voltage signal Vpp to any of the main bit lines MB0 to MB7 corresponding to the data input/output lines D0 to D7 supplied with data bits of logic "0" level. However, the other main bit line or lines remain in the ground voltage level because of data bit or bits of logic "1" level fed to the data input/output line or lines, if any. The high voltage signal Vpp and the ground voltage level are relayed from the main bit lines MB0 to MB7 to the sub-bit lines SB00 to SB07 by the column switching unit 5-1. Since the gate voltage controlling circuit 6 supplies the ground voltage level to the control gates of the memory transistors Qm of the first word memory cell 3-1 and the source voltage producing circuit 4 enters the floating state. In this situation, the high voltage signal Vpp on the sub-bit line or lines allows the electrons to be evacuated from the floating gate or gates, and the memory transistor or transistors enter a logic "0" state. The threshold level in the logic "0" state is hereinbelow referred to as "second threshold level", and the second threshold level is lower than the first threshold level. Thus, the memory transistors Qm of the first word memory cell 3-1 selectively enter the logic "0" state or remain in the erasing state (which is tantamount to a logic "1" state), and the rewrite sub-mode is completed.

If a read-out sub-mode of operation is requested with the read-out signal R and the address signal designates the first word memory cell 3-1 again, the operational phase controlling circuit 9 produces a read enable signal RE of an active level but allows the erase enable signal EE and the write enable signal WE to be recovered to the inactive level. The source controlling signal VSC and the gate controlling signal VGC are respectively shifted to the high level and the low level, and no high voltage signal Vpp is produced. With the gate controlling signal VGC of the low level, the gate voltage controlling circuit 6 supplies a gate controlling signal with a voltage level between the first and second threshold levels to the memory transistors Qm of the first word memory cell 3-1, and the source voltage producing circuit 4 supplies the ground level to the source nodes of the memory transistors Qm. Then, the memory transistors Qm of the logic "0" state provides current paths between the sub-bit lines and the ground, but no current path is established in the memory transistors Qm of the logic "1" state. The data read-out circuit 8 detects the current paths and produces an output data word consisting of data bits identical in logic state with the memory transistors Qm of the first word memory cell. The output data word is put on the data input/output lines D0 to D7.

The EEPROM device according to the present invention enters the testing mode of operation in the presence of a test signal $\overline{CTS}$ fed to the row address decoder circuit 1 and the column address decoder circuit 2. If the test signal $\overline{CTS}$ goes down to an active low level, the row address decoder circuit 1 can concurrently activate all of the word lines W0 to W31 and a half of the word lines W0 to W31 depending upon the address bits Ax0 to Ax4, and the column address decoder circuit 2 simultaneously selects all of the column selecting lines S0 to S7.

Figure 2:
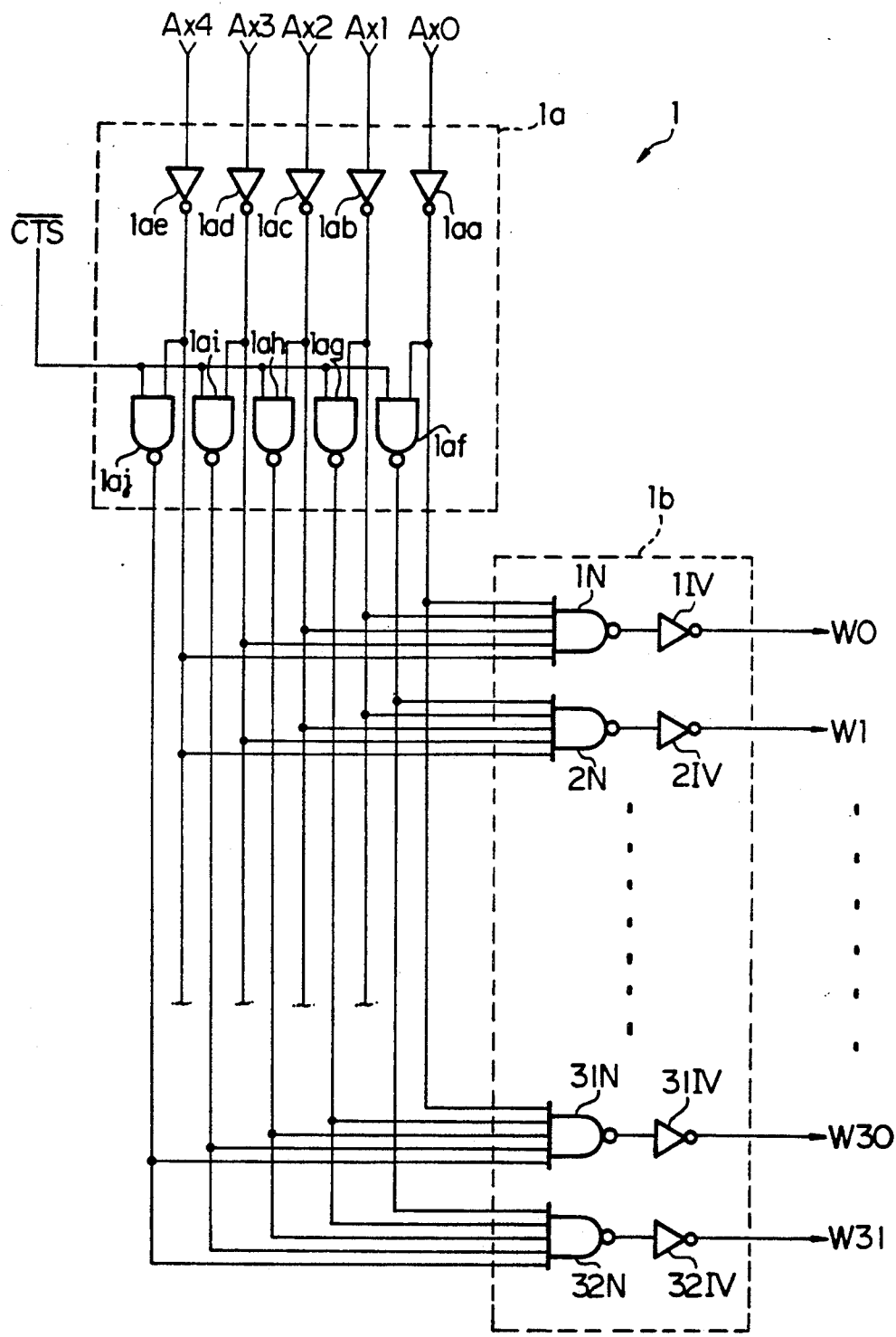
FIG. 2 is a diagram showing the circuit arrangement of a row address decoder circuit incorporated in the EEPROM device shown in FIG. 1.

Turning to FIG. 2 of the drawings, the row address decoder circuit 1 largely comprises an address buffer section 1a and a decode-and-drive section 1b. The address buffer section 1a is formed by five inverters 1aa, 1ab, 1ac, 1ad and 1ae and five NAND gates 1af, 1ag, 1ah, 1ai and 1aj, and the five inverters 1aa to 1ae are respectively coupled to first input nodes of the five NAND gates 1af to 1aj. The other nodes of the NAND gates 1af to 1aj are supplied with the test signal $\overline{CTS}$, and the NAND gates 1af to 1aj serve as inverters as long as the test signal $\overline{CTS}$ remains in the inactive high level. However, if the test signal $\overline{CTS}$ goes down to the active low level, the output signals of all of the NAND gates 1*af* to 1*aj* are fixed to the high level regardless of the address bits Ax0 to Ax4.

The decode-and-drive section 1*b* has thirty two NAND gates 1N to 32N respectively coupled to thirty two inverters 1IV to 32IV, however, FIG. 2 shows only four NAND gates 1N, 2N, 31N and 32N associated with four inverters 1IV, 2IV, 31IV and 32IV for the sake of simplicity. The first NAND gate 1N is coupled to the inverters 1*aa* to 1*ee*, but one of the input nodes of the second NAND gate 2N is coupled to the NAND gate 1*af* instead of the inverter 1*aa*. Only one input node of the NAND gate 31N is coupled to the inverter 1*aa*, and the NAND gate 32N is coupled to the NAND gates 1*af* to 1*aj* only. Thus, the connections between the address buffer section 1*a* and the NAND gates 1N to 32N are arranged in such a manner that the activated word line is changed from W0 to W31 with the address bits Ax0 to Ax4 in the absence of the test signal $\overline{CTS}$ of the active low level. If all of the address bits Ax0 to Ax4 are logic "0" level, all of the word lines W0 to W31 are activated in the presence of the test signal $\overline{CTS}$ of the active low level. However, when only the address bit Ax0 is logic "1" level and the other address bits Ax1 to Ax4 are logic "0" level, the odd words lines W0, W2, . . . and W30 remains in the inactive state and the even word lines W0, W2, . . . and W31 are concurrently activated.

Figure 3:
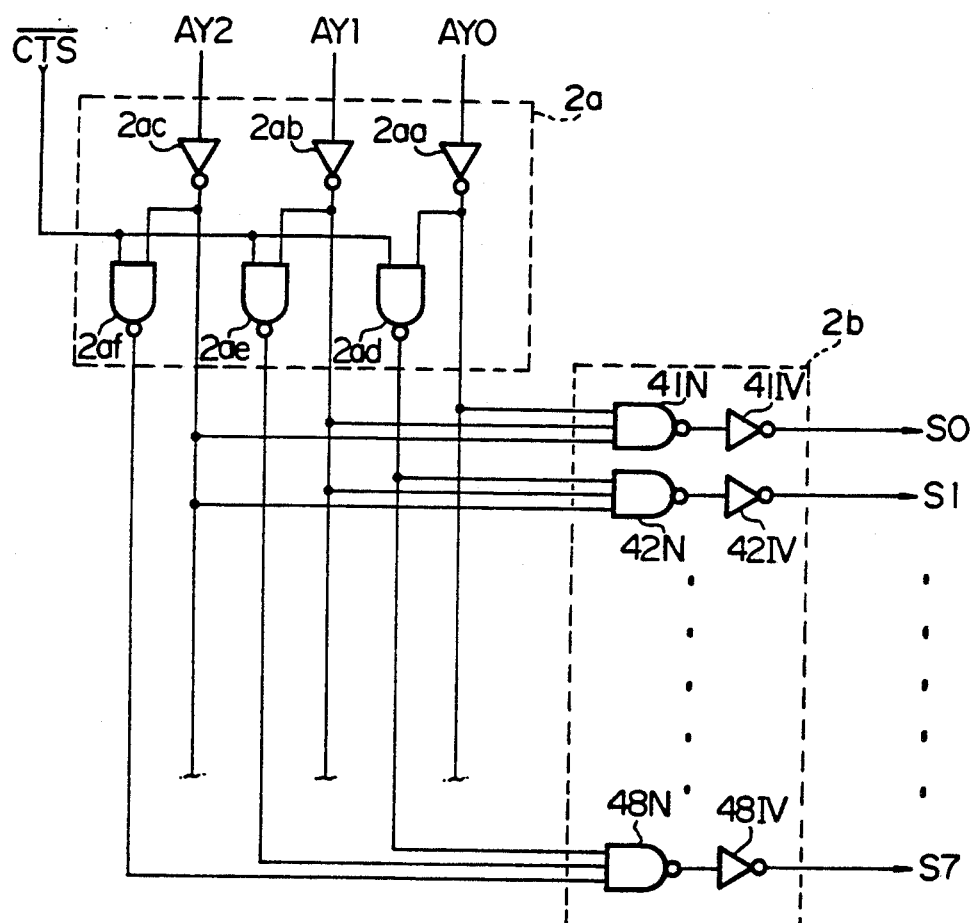
FIG. 3 is a diagram showing the circuit arrangement of a column address decoder circuit incorporated in the EEPROM device shown in FIG. 1.

FIG. 3 shows the circuit arrangement of the column address decoder circuit 2. The column address decoder circuit 2 largely comprises an address buffer section 2*a* and a decode-and-drive section 2*b* as similar to the row address decoder circuit 1. The address buffer section 2*a* has three inverters 2*aa*, 2*ab* and 2*ac* and three NAND gates 2*ad*, 2*ae* and 2*af* provided in association with the inverters 2*aa* to 2*c*, respectively, and the NAND gates 2*ad* to 2*af* are supplied with the test signal $\overline{CTS}$. The decode-and-drive section 147 has eight NAND gates respectively coupled in series to eight inverters, and only three NAND gates 41N, 42N and 48N and three inverters 41IV, 42IV and 48IV are shown in FIG. 3 for the sake of simplicity. The NAND gates 2*ad* to 2*af* produce logic "1" signals in the presence of the test signal $\overline{CTS}$ of the active low level regardless of the address bits Ay0 to Ay2 and serve as inverter in so far as the test signal $\overline{CTS}$ goes up to the inactive high level. The output signals of the inverter circuits 2*aa* to 2*ac* and the output signals of the NAND gates 2*ad* to 2*af* are selectively supplied to the NAND gates 41N to 48N in such a manner that one of the column selecting lines S0 to S7 is sequentially selected by changing the address bits from "000" to "111". However, if all of the address bits Ay0 to Ay2 are logic "0" level, all of the column selecting lines S0 to S7 are selected by the column address decoder circuit 2.

The EEPROM device thus arranged are improved in formation of a checkerwise test patter used for the diagnosis of interference between the cells, and the time period used for the formation of the checkerwise test pattern is drastically shrunk. Namely, when the EEPROM enters the testing mode of operation with the test signal $\overline{CTS}$ of the active low level, the address bits Ax0 to Ax4 and Ay0 to Ay2 of logic "0" level are supplied to the row address decoder circuit 1 and the column address decoder circuit 2, and the erase signal E is supplied to the operational phase controlling circuit 9. The erasing phase of operation is carried out for all of the word memory cells 3-1 to 3-256. Subsequently, a data word of "10101010" are supplied to the data input-/output lines D0 to D7, and the write-in signal E is supplied to the operational phase controlling circuit instead of the erase signal E. This results in that the data word "10101010" is written into all of the word memory cells. The data word "10101010" may have been supplied from the erasing phase of operation. The erase signal E is supplied to the operational phase controlling circuit 9 together with the address bits Ax0 to Ax4 and Ay0 to Ay2 of "10000" and "000", and the row address decoder circuit 1 activates every second word line W1, W3, . . . and W31, thereby causing the data words to be erased from the word memory cells 3-9 to 3-16, . . . and 3-249 to 3-256 coupled to the activated word lines W1, W3, . . . and W31. After or, alternatively, from the erasing phase of operation, another data word of "01010101" is supplied to the data input/output lines D0 to D7, and the erase signal E is replaced with the write-in signal W. Then, the data word of "01010101" is concurrently written into the word memory cells 3-9 to 3-16 and 3-249 to 3-256, and a checkerwise test pattern is completed in the memory cell array 3 where a data bit memorized in each memory element is opposite in logic level to those in the adjacent four memory elements. In this instance, the checkerwise test pattern is completed within an extremely short time period of about 20 millisecond. After the formation of the checkerwise test pattern, the test signal $\overline{CTS}$ is recovered from the active low level to the inactive high level, and the read signal R is fed to the operational phase controlling circuit 9. All of the data words are sequentially read out from the memory cell array 3 by changing the address bits Ax0 to Ax4 and Ay0 to Ay2. Each of the data words thus read out is examined to see if any one of the data bits is inverted from the original logic level under the influence of the data bits of the opposite logic level memorized in the adjacent memory elements. Thus, the EEPROM device according to the present invention achieves the formation of the checkerwise test pattern within an extremely short time period which is a twenty eighth of that consumed by the prior art EEPROM device writing data words from a memory cell to the next memory cell. The EEPROM according to the present invention well cope with the increasing integration density, because a checkerwise test pattern is completed within the same time period. Moreover, about 10 millisecond is merely consumed for formation of a data bit matrix consisting of data bits of logic "1" or "0" level which is used in another diagnostic operation.

In the first embodiment, the gate voltage controlling circuit 6, the data write-in circuit 7, the data read-out circuit 8 and the operational phase controlling circuit 9 as a whole constitute data means. "First state" stands for the address bits Ax0 to Ax4 of logic "0" level, and "second state" indicates the address bits Ax0 of logic "1" level and Ax1 to Ax4 of logic "0" level. The NAND gates 1*af* to 1*aj* serve as means incorporated in the row address decoder circuit.

Figure 4:
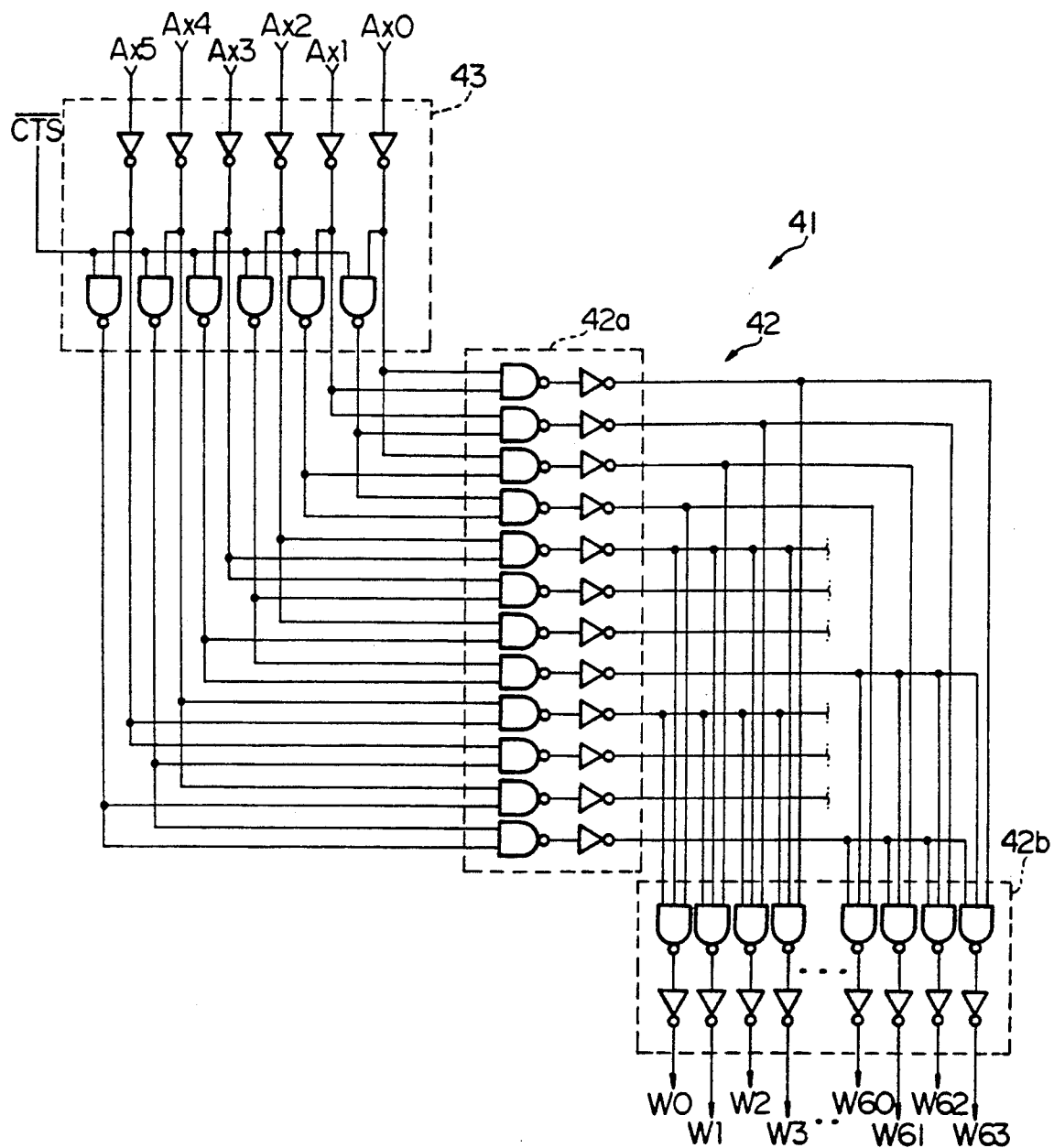
FIG. 4 is a diagram showing the circuit arrangement of another row address decoder circuit.

FIG. 4 shows another row address decoder circuit 41. A two stage selecting technique is employed in the row address decoder circuit 41, and a decode-and-drive section 42 thereof has a predecoding unit 42*a* and a main decode-and driving unit 42*b*. The row address decoder circuit 41 further has an address buffer 43 supplied with six address bits Ax0 to Ax5, and, accordingly, the decode-and-drive section 42 selects a word line from sixty four candidates W0 to W63. Both of the units 42*a* and 42*b* are fabricated by a plurality of NAND gates and inverter circuits arranged as shown in FIG. 4, and a series combination of an inverter and a NAND gate is merely added to the address buffer section 1a shown in FIG. 2. The row address buffer circuit 41 thus arranged is similar in circuit behavior to the row address decoder circuit 1, and no description is incorporated hereinbelow.

Second Embodiment

Figure 5:
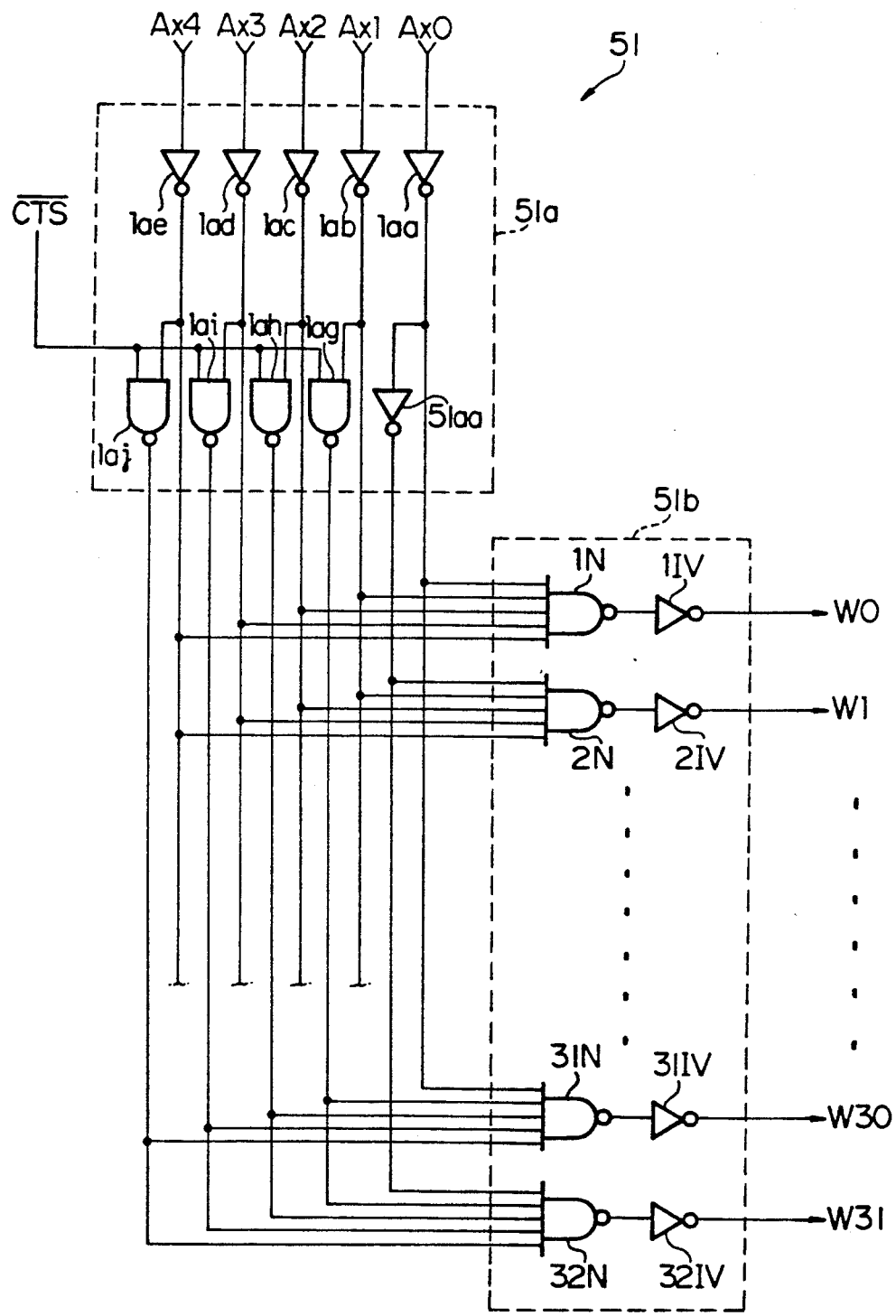
FIG. 5 is a diagram showing the circuit arrangement of still another row address decoder circuit incorporated in another EEPROM device according to the present invention.

Turning to FIG. 5 of the drawings, a row address decoder circuit 51 incorporated in another EEPROM device according to the present invention is illustrated. Other component circuits and units are similar to those of the EEPROM shown in FIGS. 1 and 3, and, for this reason, description on these circuits and units is omitted for avoiding repetition.

The row address decoder circuit 51 has an address buffer section 51a and a decode-and-drive section 51b, and the decode-and-drive section 51b is similar in circuit arrangement to the decode-and-drive section 1b. For this reason, the component elements of the decode-and-drive section 51b is designated by the same reference marks used in FIG. 2. In the row address decoder circuit 51, an inverter 51aa is coupled to the inverter 1aa instead of the NAND gate 1af, however, the other components 1aa to 1ae and 1ag to 1aj are similar to those of the address buffer section 1a.

In operation, when the test signal $\overline{CTS}$ goes down to the active low level, the EEPROM enters the testing mode of operation. If the address bits Ax0 to Ax4 are logic "0" level, the odd word lines W0, W2, ... and W30 are concurrently activated; however, the even word lines W1, W3, ... and W31 are alternatively activated in the presence of the address bits Ax0 of logic "1" level and Ax1 to Ax4 of logic "0" level. Then, the checkerwise test pattern is formed in the memory cell array 3 within the same time period as the first embodiment. However, the first embodiment is easy for the formation of the data bit matrix consisting of the data bits of either logic "1" or "0" level.

In the second embodiment, the "first state" stands for the address bits Ax0 to Ax4 of logic "0" level, and the "second state" indicates the address bits Ax0 of logic "1" level and Ax1 to Ax4 of logic "0" level.

As will be understood from the foregoing description, the EEPROM device according to the present invention is advantageous over the prior art EEPROM device in that a checkerwise test pattern is formed in the memory cell array within an extremely short time period. This advantage is derived from the row address decoder circuit 1, 41 or 51 capable of concurrently activating at least every second word line in the testing mode of operation.

Although particular embodiments of the present invention have been shown and described, it will be obvious to those skilled in the art that various changes and modifications may be made without departing from the spirit and scope of the present invention. For example, the row address decoder circuit 1 concurrently activates the even word lines W1, W3, ... and W31 for rewriting the data words; however, the odd word lines may be activated in another example.

What is claimed is:

1. A non-volatile semiconductor memory device comprising
    a) a plurality of word lines,
    b) a plurality of bit lines defining a plurality of locations in combination with said word lines,
    c) a memory cell array having a plurality of non-volatile memory cells respectively disposed at said locations and memorizing pieces of data information in a rewriteable manner, respectively,
    d) a row address decoder circuit responsive to an address signal indicative of a row address for selectively activating at least one of said word lines,
    e) a column address decoder circuit responsive to an address signal indicative of a column address for selecting at least one of said bit lines, and
    f) data means for selectively carrying out erasing, write-in and read-out operations on at least one of said non-volatile memory cells located at the location defined by said one of said word lines in combination with said one of said bit lines, in which said row address decoder circuit has means for concurrently activating at least every second word line in the present of a test signal if said row address signal is indicative of a first state, and in which said means of said row address decoder circuit concurrently activate the other word lines in the presence of said test signal when said row address signal is indicative of a second state, wherein said data means carry out at least said erase and write-in operations on a plurality of said non-volatile memory cells coupled to said word lines to be activated in the presence of said test signal.

2. A non-volatile semiconductor memory device as set forth in claim 1, in which said column address decoder circuit has means for selecting all of said bit lines in the presence of said test signal when said column address signal is indicative of a predetermined state.

3. A non-volatile semiconductor memory device as set forth in claim 2, in which said row address decoder circuit comprises an address decoder section supplied with said test signal and with said row address signal, and a decode-and-drive section coupled to said address decoder section and selectively activating one of said word line in the absence of said test signal and said plurality of word lines in the presence of the test signal.

4. A non-volatile semiconductor memory device as set forth in claim 3, in which said address buffer section comprises a plurality of first inverters respectively supplied with address bits of said row address signal and a plurality of first NAND gates having respective first input nodes supplied with said test signal and respective second nodes coupled to said first inverters, respectively.

5. A non-volatile semiconductor memory device as set forth in claim 3, in which said address buffer section comprises a plurality of first inverters respectively supplied with address bits of said row address signal, a second inverter coupled to one of said inverters, and a plurality of first NAND gates having respective first input nodes supplied with said test signal and respective second nodes coupled to said first inverters, respectively.

6. A non-volatile semiconductor memory device as set forth in claim 4, in which said decode-and-drive section comprises a plurality of first series combinations each having a second NAND gate coupled to a third inverter and in which said second NAND gate of each first series combination having a plurality of input nodes selectively coupled to said first inverters and/or said first NAND gates.

7. A non-volatile semiconductor memory device as set forth in claim 6, in which said decode-and-drive section further has a predecoding unit consisting of a plurality of second series combinations each having a third NAND gate coupled to a fourth inverter, said plurality of second series combinations being selectively coupled to said plurality of first series combinations.

8. A non-volatile semiconductor memory device as set forth in claim 2, in which said column address decoder circuit comprises an address buffer section and a decode-and-drive section.

9. A non-volatile semiconductor memory device as set forth in claim 8, in which said address buffer section comprises a plurality of fifth inverters supplied with address bits of said column address signal, and a plurality of fourth NAND gates having respective first input nodes supplied with said test signal and respective second input nodes coupled to said fifth inverters, respectively.

10. A non-volatile semiconductor memory device as set forth in claim 9, in which said decode-and-drive section comprises a plurality of third series combination each having a fifth NAND gate coupled to a sixth inverter and in which said fifth NAND gate of each third series combination has a plurality of input nodes selectively coupled to said fifth inverters and/or fourth NAND gates.

11. A non-volatile semiconductor memory device as set forth in claim 1, in which a checkerwise test pattern is formed in said memory cell array in the presence of said test signal, and in which said checkerwise test pattern comprises first pieces of data information memorized in said non-volatile memory cells coupled to the odd word lines of said plurality of word lines and second pieces of data information different in bit string from said first pieces of data information and memorized in said non-volatile memory cells coupled to the even word lines of said plurality of word lines.

12. A non-volatile semiconductor memory device as set forth in claim 11, in which each of said first pieces of data information has a bit string formed with a unit bit pattern of "10" repeated predetermined times, and in which each of said second pieces of data information has a bit string formed with a unit bit pattern of "01" repeated predetermined times.

13. A non-volatile semiconductor memory device having a usual mode of operation and a testing mode of operation, comprising:
   a) a memory cell array having a plurality of non-volatile memory cells arranged in rows and columns and respectively memorizing pieces of data information in a rewriteable manner;
   b) a plurality of word lines respectively coupled to the rows of said non-volatile memory cells;
   c) a plurality of bit lines respectively coupled to the columns of said non-volatile memory cells;
   d) a row address decoder circuit responsive to a row address signal and activating one of said word lines in said usual mode of operation;
   e) a bit line selecting unit responsive to a column address signal and selecting one of said bit lines in said usual mode of operation; and
   f) data means for reading out one of said pieces of data information from one of said non-volatile memory cells coupled to said one of said word lines and said one of said bit lines in said usual mode of operation, said data means further being operative to rewrite the piece of data information memorized in said one of said non-volatile memory cells in said usual mode of operation, in which said data means form a checkerwise test pattern having first pieces of data information memorized in said non-volatile memory cells coupled to the odd word lines of said plurality of word lines and second pieces of data information each different in bit string from said first pieces of data information memorized in said non-volatile memory cells coupled to the even word lines of said plurality of word lines in said testing mode of operation, and in which said row address decoder circuit concurrently activates first group of said word lines in the presence of said row address signal indicative of a first state and second group of said word lines in the presence of said row address signal indicative of a second state while said data means form said checkerwise test pattern.

14. A non-volatile semiconductor memory device as set forth in claim 13, in which each of said first pieces of data information has a bit string formed with a unit bit pattern of "10" repeated predetermined times, and in which each of said second pieces of data information has a bit string formed with a unit bit pattern of "01" repeated predetermined times.

15. A method of forming a checkerwise test pattern in a plurality of non-volatile memory cells arranged in rows and columns incorporated in a non-volatile semiconductor memory device, said non-volatile memory device further comprising a plurality of word lines for concurrently activating the rows of said non-volatile memory cells, respectively, and data means for erasing and writing pieces of data information from and into said plurality of non-volatile memory cells, comprising the steps of:
   a) driving all of said word lines for activating all of said non-volatile memory cells;
   b) concurrently erasing pieces of data information previously memorized in said non-volatile memory cells;
   c) concurrently writing first pieces of data information into all of said non-volatile memory cells;
   d) driving every second word lines for activating said non-volatile memory cells coupled to every second word line;
   e) concurrently erasing said first pieces of data information from said non-volatile memory cells coupled to every second word line; and
   f) concurrently writing second pieces of data information into said non-volatile memory cells coupled to every second word line, in which each of said first pieces of data information is indicated by a first bit string different from a second bit string indicative of each of said second pieces of data information.

16. A method as set forth in claim 15, in which said first bit string is formed with a unit bit pattern of "10" repeated predetermined times, and in which said second bit string is formed with a unit bit pattern of "01" repeated predetermined times.

17. A method of forming a checkerwise test pattern in a plurality of non-volatile memory cells arranged in rows and columns incorporated in a non-volatile semiconductor memory device, said non-volatile memory device further comprising a plurality of word lines for concurrently activating the rows of said non-volatile memory cells, respectively, and data means for erasing and writing pieces of data information from and into said plurality of non-volatile memory cells, comprising the steps of:

a) driving the odd word lines of said plurality of word lines for activating said non-volatile memory cells coupled thereto;
b) concurrently erasing pieces of data information previously memorized in said non-volatile memory cells coupled to said odd word lines;
c) concurrently writing first pieces of data information into said non-volatile memory cells coupled to said odd word lines;
d) driving the even word lines of said plurality of word lines for activating said non-volatile memory cells coupled thereto;
e) concurrently erasing pieces of data information previously memorized in said non-volatile memory cells coupled to said even word lines; and
f) concurrently writing second pieces of data information into said non-volatile memory cells coupled to said even word lines, in which each of said first pieces of data information is indicated by a first bit string different from a second bit string indicative of each of said second pieces of data information.

18. A method as set forth in claim 17, in which said first bit string is formed with a unit bit pattern of "10" repeated predetermined times, and in which said second bit string is formed with a unit bit pattern of "01" repeated predetermined times.

19. A non-volatile semiconductor memory device comprising
a) a plurality of word lines,
b) a plurality of bit lines,
c) a memory cell array having non-volatile memory cells electrically erasable and writeable, said non-volatile memory cells being disposed at crossing points between said word lines and said bit lines, respectively,
d) a row decoder responsive to a row address and operative to drive one of said word lines,
e) a column decoder responsive to a column address and operative to drive at least one of said bit lines, and
f) means operative to selectively carry out erasing, write-in and reading-out operations on one of said non-volatile memory cells disposed at the crossing point between said one of said word lines and said one of said bit lines, wherein said non-volatile semiconductor memory device further comprises means for concurrently driving at least every second word line in the co-presence of a test signal and said row address indicative of a first state and for concurrently driving the other word lines in the copresence of said test signal and said row address indicative of a second state.

* * * * *